(12) United States Patent
Lamesch et al.

(10) Patent No.: US 9,731,627 B2
(45) Date of Patent: Aug. 15, 2017

(54) CAPACITIVE SENSOR

(71) Applicant: IEE International Electronics & Engineering S.A., Echternach (LU)

(72) Inventors: Laurent Lamesch, Reichlange (LU); Michael Puetz, Trier (DE); David Hoyer, Ayl (DE); Andreas Petereit, Schweich (DE); Thomas Meyers, Bitburg (DE); Frank Althaus, Saarbrucken (DE); Michael Virnich, Korlingen (DE)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

(21) Appl. No.: 14/766,727

(22) PCT Filed: Feb. 6, 2014

(86) PCT No.: PCT/EP2014/052291
§ 371 (c)(1),
(2) Date: Aug. 7, 2015

(87) PCT Pub. No.: WO2014/122197
PCT Pub. Date: Aug. 14, 2014

(65) Prior Publication Data
US 2015/0367751 A1    Dec. 24, 2015

(30) Foreign Application Priority Data
Feb. 7, 2013    (LU) .......................................... 92149

(51) Int. Cl.
*G08B 21/00*    (2006.01)
*B60N 2/00*    (2006.01)
(Continued)

(52) U.S. Cl.
CPC ............... *B60N 2/002* (2013.01); *B60N 2/56* (2013.01); *B60N 2/5685* (2013.01);
(Continued)

(58) Field of Classification Search
None
See application file for complete search history.

(56) References Cited

U.S. PATENT DOCUMENTS 6,650,227 B1 * 11/2003 Bradin ................. G06K 7/0008
340/10.1
2007/0192007 A1    8/2007 Stanley et al.

FOREIGN PATENT DOCUMENTS

| EP | 1580080 A1 | 9/2005 |
|---|---|---|
| WO | 2012038325 A1 | 3/2012 |
| WO | 2012113833 A1 | 8/2012 |

OTHER PUBLICATIONS

Joshua Smith et al. "Electric Field Sensing for Graphical Interfaces", IEEE Computer Graphics and Applications (Computer Graphics I/O Devices), May/Jun. 1998, pp. 54-60.
(Continued)

*Primary Examiner* — Adolf Dsouza
(74) *Attorney, Agent, or Firm* — Reising Ethington P.C.

(57) ABSTRACT

A capacitive sensor for a vehicle seat comprises an antenna electrode and a control and evaluation circuit operatively connected to the antenna electrode. The control and evaluation circuit is configured to operate in a first mode of operation, during which it measures alternating electrical current flowing between the antenna electrode and ground. The capacitive sensor comprises a seat frame connector for connecting the control and evaluation circuit to the seat frame of the vehicle seat. The control and evaluation circuit
(Continued)

is configured to operate in a second mode of operation, during which it measures electrical current flowing into the seat frame connector.

11 Claims, 4 Drawing Sheets

(51) Int. Cl.
*G01D 5/24* (2006.01)
*G01L 1/14* (2006.01)
*H03K 17/955* (2006.01)
*B60R 21/015* (2006.01)
*B60N 2/56* (2006.01)

(52) U.S. Cl.
CPC ..... *B60R 21/01532* (2014.10); *G01D 5/2405* (2013.01); *G01L 1/144* (2013.01); *H03K 17/955* (2013.01); *H03K 2217/960765* (2013.01)

(56) References Cited

OTHER PUBLICATIONS

International Search Report and Written Opinion issued May 23, 2014 re: Application No. PCT/EP2014/052291.

\* cited by examiner

CAPACITIVE SENSOR

TECHNICAL FIELD

The present invention generally relates to a capacitive sensor, e.g. for detecting the presence or absence of a person on a seat (seat occupancy detection) or the presence or absence of a person's hand on the steering wheel of a car (hands off or hands on detection.)

BACKGROUND ART

Capacitive sensors have a wide range of applications, and are among others used for the detection of the presence and/or the position of conductive body in the vicinity of an antenna electrode. As used herein, the term "capacitive sensor designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from transmitting antenna electrodes—at which the influence of an object or living being on the electric field is detected.

The technical paper entitled "Electric Field Sensing for Graphical Interfaces" by J. R. Smith, published in Computer Graphics I/O Devices, Issue May/June 1998, pp 54-60 describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength is generally determined by applying an alternating voltage signal to an antenna electrode and by measuring the current flowing from that antenna electrode either towards ground (in the loading mode) or into a second antenna electrode (in coupling mode). This current may be measured by a transimpedance amplifier, which is connected to the sensing electrode and which converts the current flowing into the sensing electrode into a voltage proportional to the current.

When a capacitive sensor is used for occupancy detection, in a vehicle seat, the impedance between the antenna electrode and ground depends not only on the presence or absence of an occupant on the seat but also on other conducting bodies in the vicinity of the antenna electrode. One of these conducting bodies is the (typically metal) seat frame. Depending on the car model, the seat frame may or may not be electrically connected to the vehicle frame and this has an influence on the measured impedance between the antenna electrode and ground.

U.S. 2007/0192007 A1 disclose an occupant classification system comprising so-called "identifying" and "monitoring" circuit configured to identify whether the seat pan, the seat back frame and the seat heating element are grounded to a circuit ground.

BRIEF SUMMARY

The invention provides a capacitive sensor for a vehicle seat, configured for monitoring whether the seat frame is grounded.

It is proposed a capacitive sensor for a vehicle seat, comprising an antenna electrode for being arranged in the vehicle seat and a control and evaluation circuit operatively connected to the antenna electrode. The control and evaluation circuit is configured to operate in a first mode of operation, during which the control and evaluation circuit is configured to measure alternating electrical current flowing between the antenna electrode and ground. According to an aspect of the invention, the capacitive sensor comprises a seat frame connector for connecting the control and evaluation circuit to the seat frame of the vehicle seat and for temporarily coupling a measurement circuit of the control and evaluation circuit to the seat frame of the vehicle seat via said seat frame connector. The control and evaluation circuit is configured to operate in a second mode of operation, during which the control and evaluation circuit is configured to measure (alternating) electrical current flowing into the seat frame connector. As used herein, the term "seat frame" is used to designate frame portions in the backrest of the seat and/or frame portions in the seating portion thereof, e.g. the seat pan, if the seat comprises any.

It will be noted, that during the first mode of operation, i.e. during the measuring mode, the seat frame connector is preferably decoupled from the measurement circuit of the control and evaluation circuit (and coupled e.g. to ground), so that the seat frame connector does not influence the measurement signal during this mode of operation. During the second mode of operation, i.e. during the diagnostics mode, is operatively connected to the measurement circuit so that the current flowing into the seat frame connector may be measured. As will be appreciated, by measuring the electrical current flowing into the seat frame connector, it is possible to check whether the seat frame has its own connection to ground. Thus, if the electrical current flowing into the seat frame connector satisfies certain criteria (e.g. in terms of amplitude and phase), the seat frame is considered to be tied to ground.

Preferably, the control and evaluation circuit comprises an oscillator and a transimpedance amplifier having a reference input, a current signal input operatively couplable to the antenna electrode, and an output, the oscillator being connected to the reference input for applying the alternating voltage thereto, the transimpedance amplifier being configured to drive an alternating current into the current signal input such that a voltage difference between the reference input and the current signal input is substantially cancelled and to output a voltage on the output indicative of the alternating current. The current signal input of the transimpedance amplifier is preferably operatively coupled to the antenna electrode for injecting the alternating current into the antenna electrode. The alternating current may be injected, e.g. by inductive coupling (i.e. via a transformer), capacitive coupling (via a capacitor) and/or direct coupling (i.e. by wiring).

According to a preferred embodiment of the invention, the capacitive sensor comprises a switching device configured and arranged to operatively connect the seat frame connector alternately to a ground conductor and to the reference input. Preferably, the control and evaluation circuit is configured, when in the second mode of operation and if the measured electrical current flowing into the seat frame connector fails to meet the criteria allowing to conclude that the seat frame is tied to ground, to carry out the following:
a) measuring alternating electrical current flowing between the antenna electrode and ground while connecting the seat frame connector to the ground conductor using the switching device and
b) measuring alternating electrical current flowing between the antenna electrode and ground while connecting the seat frame connector to the reference input using the switching device.

The control and evaluation circuit is preferably configured to determine whether at least one path to ground is available to the seat frame based upon the measurements under a) and b) and to output an error signal if no path to ground is determined to be available to the seat frame.

As will be appreciated, if the electrical current flowing into the seat frame connector is low, this may have two causes (which may occur at the same time): 1) the seat frame has no or only a bad connection of its own to ground and/or 2) the seat frame connector is interrupted or badly connected to the seat frame. By comparing the alternating electrical currents flowing into the antenna electrode when the seat frame connector is grounded and when it is driven with a voltage having the same amplitude and phase as the voltage on the antenna electrode, the control and evaluation circuit detects whether the seat frame connector is connected to the seat frame. If the difference between the currents measured under a) and b) significantly departs from its expected value, the control and evaluation circuit detects a fault (interruption of the wire between the seat frame and the seat frame connector) and reacts in consequence, e.g. by issuing an error signal, which tells any client appliance (such as e.g. an airbag system, a seat belt tensioner, a warning lamp, etc.) that the capacitive sensor is defective.

According to a preferred embodiment of the invention, the control and evaluation circuit comprises a current meter configured and arranged to measure electrical current flowing into the seat frame connector. The current meter may e.g. comprise an impedor arranged between the oscillator and the seat frame connector and a voltage detector configured and arranged to measure voltage across the impedor. As used herein, the term "impedor" designates a resistor, a capacitor, an inductor or any combination of these components.

A preferred aspect of the present invention relates to a vehicle seat comprising a capacitive sensor as described hereinabove.

Another preferred aspect of the present invention relates to a combined heating and capacitive sensing system comprising a capacitive sensor as described hereinabove, wherein the heating element serves both for heating and as the antenna electrode of the capacitive sensing subsystem. Yet another preferred aspect of the present invention thus relates to a vehicle seat comprising a combined heating and capacitive sensing system.

BRIEF DESCRIPTION OF THE DRAWINGS

Further details and advantages of the present invention will be apparent from the following detailed description of not limiting embodiments, with reference to the attached drawings, wherein.

DESCRIPTION OF PREFERRED EMBODIMENTS

Figure 1:
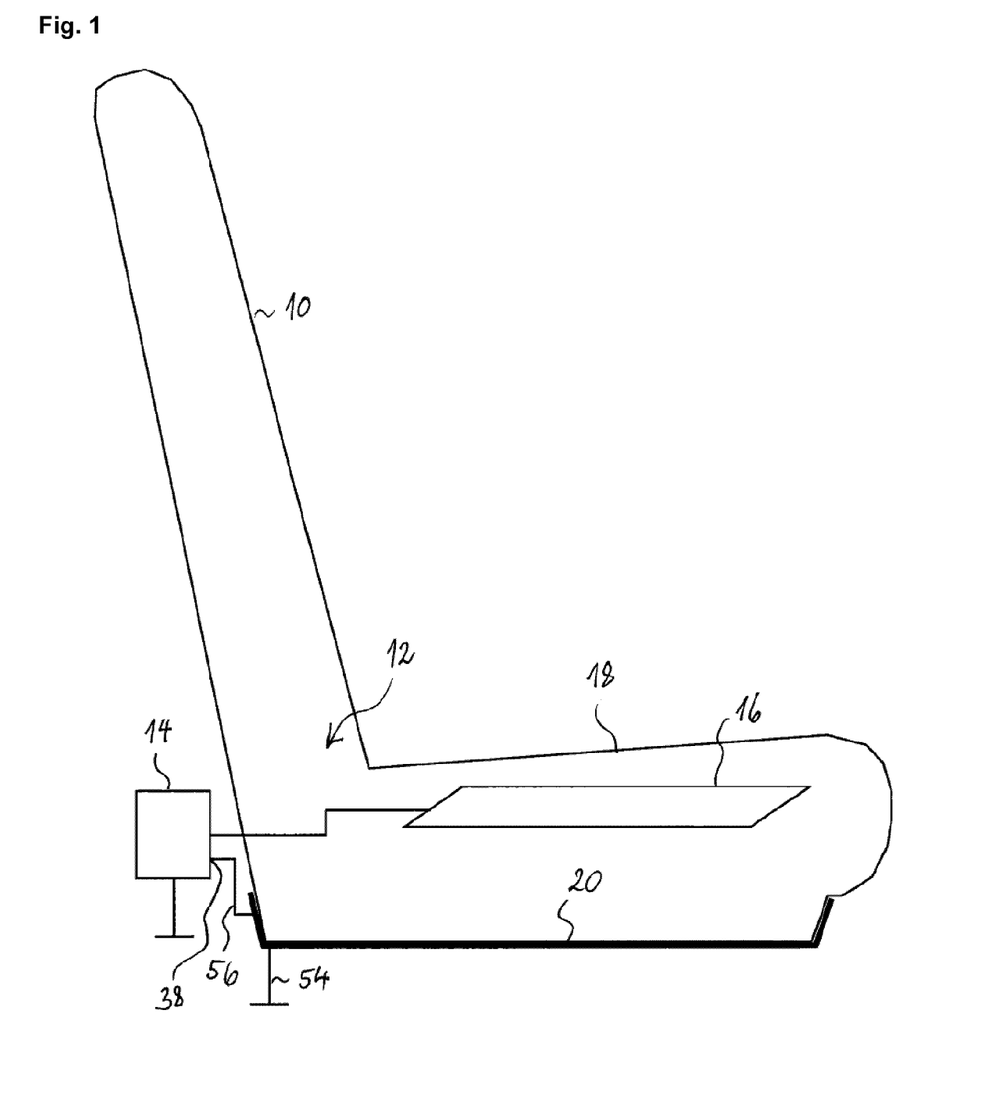
FIG. 1 is a schematic view of a car seat equipped with a capacitive sensor according to a first preferred embodiment of the invention.
Figure 2:
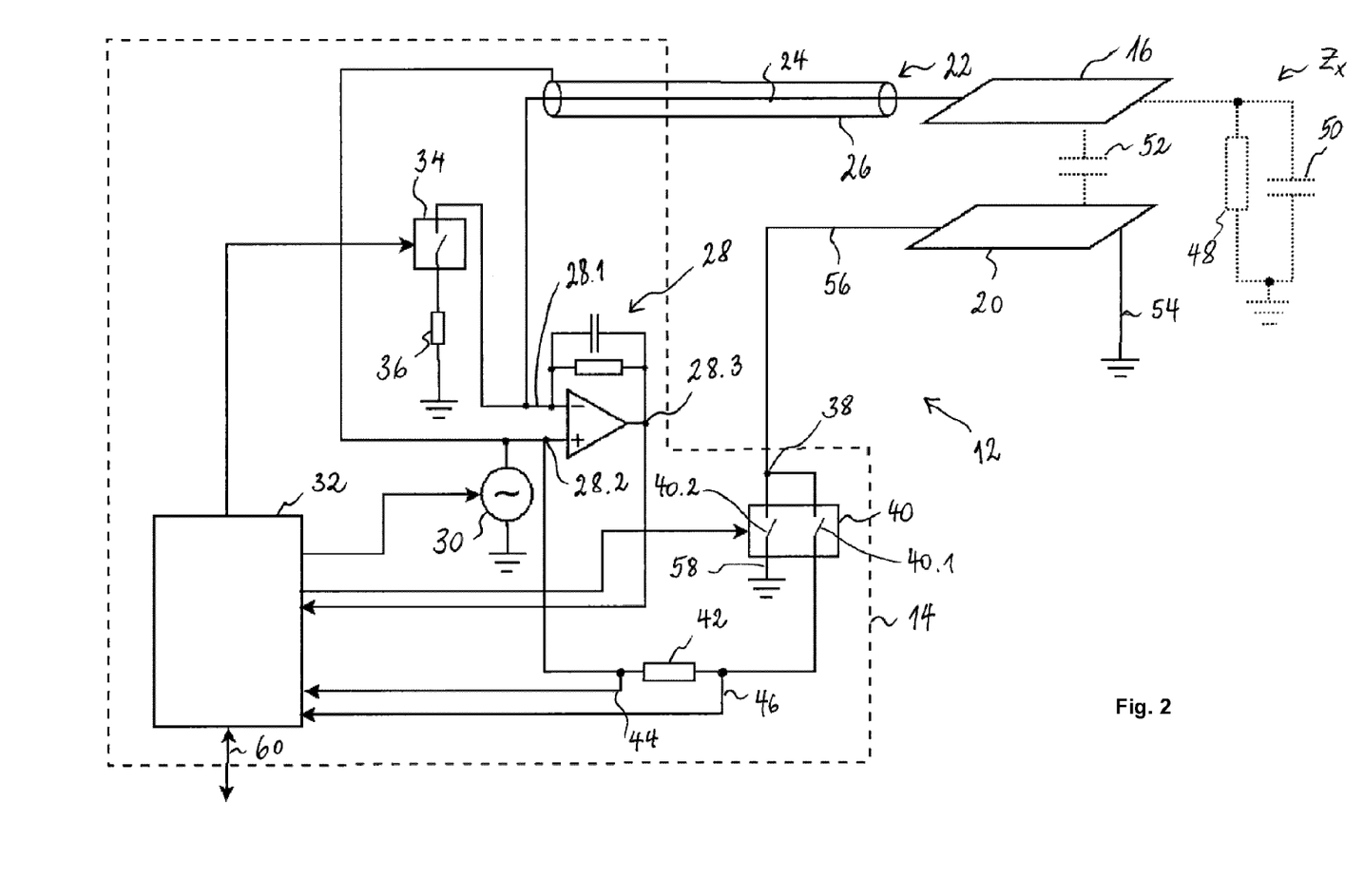
FIG. 2 is a schematic diagram of the circuitry of the capacitive sensor of FIG. 1.

FIGS. 1 and 2 illustrate a first preferred invention embodiment, which is a car seat 10 comprising a capacitive sensor 12. The capacitive sensor 12 comprises an electronic control module 14, which implements the control and evaluation circuitry of the capacitive sensor 12, and an antenna electrode 16, arranged between the cover and the foam padding of the seating portion 18 of the car seat 10. The car seat 10 has a supporting frame, of which only the seat pan 20 is shown for the sake of clarity of the drawings.

The capacitive sensor 12 is configured to detect the occupancy state of the vehicle seat 10 based upon electrical impedance between the antenna electrode 16 and ground. If an occupant is present on the vehicle seat 10, he or she bridges a part of the gap between the antenna electrode and the vehicle body (which is on ground potential) and thus increases the capacitance of the capacitor formed by the antenna electrode 16 and the vehicle body as the counter-electrode. The capacitive sensor detects the change in capacitance as part of the complex impedance between the antenna electrode and ground. A part of the complex impedance between the antenna electrode and ground also depends on the geometry of the seat frame and whether the seat frame is grounded or not ("floating"). Accordingly, measures have to be taken to ascertain that the seat frame remains in the state (grounded or floating), which the capacitive sensor has been calibrated for. In the context of the present, it is assumed that the capacitive sensor is calibrated for being used with a seat having a grounded seat frame. It shall be noted that certain car seats do not comprise any seat pan 20 (the seat cushion may in this case be supported by springs) but this does not change the fact that the seat frame state has to be monitored.

The capacitive sensor 12 thus comprises a seat frame connection, which is wired to the seat frame (in FIG. 1: to the seat pan 20 as part of the seat frame). The electronic control module 14 is configured to determine, from time to time, whether the seat frame is correctly grounded.

FIG. 2 shows a schematic circuit diagram of the capacitive sensor 12. The control and evaluation circuit (implemented by electronic control module 14) is connected to the antenna electrode 16 by a shielded cable 22 (e.g. a coaxial cable), which comprises a core conductor (inner conductor) 24 and a shield conductor (tubular shield) 26 that surrounds the core conductor 24 and that is electrically insulated from it. The core conductor 24 is operatively connected to the current signal input 28.1 of a transimpedance amplifier 28, whereas the shield conductor 26 is operatively connected to the reference input 28.2 of the transimpedance amplifier 28. An alternating voltage source 30 (e.g. a numerically controlled oscillator) is connected to the reference input 28.2 so as to apply an alternating voltage thereto. The transimpedance amplifier 28 is configured to drive a current into its current signal input 28.1, such that the voltage difference between the reference input 28.2 and the current signal input 28.1 is substantially cancelled. The voltage produced on the output 28.3 of the transimpedance amplifier 28 is indicative of the current flowing in or out of the current signal input 28.1. The electronic control module 14 further comprises a switch 34, configured and arranged for switching a normative impedance 36 electrically in parallel to the impedance between the antenna electrode 16 and ground. The electronic control module 14 is connected to the seat frame (represented here as seat pan 20) via a seat frame connector 38. A switching device 40 is provided for connecting the seat frame connector 38 alternatively to ground or to the reference input 28.2 of the transimpedance amplifier 28.

The output 28.3 of the transimpedance amplifier 28 is connected to a microcontroller 32. The microcontroller 32 controls the operation of the numerically controlled oscillator 30, the switch 34, the switching device 40 and measures the voltage drop across the resistor 42 via voltage taps 44 and 46. The electronic control module 14 carries out different modes of operation.

Measurement Mode

In measurement mode, the microcontroller keeps the switches 34 and 40.1 open and switch 40.2 closed. The shield conductor is thus coupled to the reference input 28.2 of the transimpedance amplifier 28. The oscillator 30 outputs an alternating voltage (e.g. in the frequency range of 50 to 600 kHz.) The transimpedance amplifier 28 attempts to maintain its current signal input 28.1 at the same electric potential as the reference input 28.2, which means that the voltages on the transimpedance amplifier inputs 28.1 and 28.2 are essentially equal in frequency, amplitude and phase. The alternating voltage is applied to the antenna electrode 16 via the core conductor 24 of the shielded cable 22. Since the shield conductor 26 and the core conductor 24 of the shielded cable 22 are at the same electrical potential, the capacitance of the shielded cable 22 is essentially compensated for, i.e. during the measurement mode no alternating current flows between the core conductor 24 and the shield conductor 26. It follows that, except for inevitable but small losses, all alternating current injected through the core conductor 24 flows to ground via the complex impedance $Z_x$ between the antenna electrode 16 and ground. The complex impedance $Z_x$ includes a variable component (including all variations of impedance caused by changes of the occupancy state), represented in FIG. 2 as a resistance 48 and a capacitance 50, and a (theoretically) constant component, represented as capacitance 52. The constant component largely depends on the configuration of the seat, in particular on the layout of the seat frame. When the complex impedance $Z_x$ changes (e.g. because a seat occupant is becoming seated), the alternating current supplied by the transimpedance amplifier 28 changes accordingly, which in turn is reflected by the alternating voltage on the output 28.3 of the transimpedance amplifier 28. The complex impedance can be calculated as $Z_x=U_{osc}/I_{TIA}$, where $U_{osc}$ is the complex voltage output by the oscillator 30 and $I_{TIA}$ is the complex current flowing into the current input node 28.1 of the transimpedance amplifier 28. With $I_{TIA}=\alpha U_{out}$, where $\alpha$ is a proportionality factor and $U_{out}$ is the voltage output by the transimpedance amplifier 28, one finally obtains $Z_x$ by: $Z_x=U_{osc}/(\alpha U_{out})$.

Based on the measured value of the complex impedance $Z_x$, the microcontroller may determine e.g. the occupancy state of the vehicle seat 10. However, if it cannot be guaranteed that the seat frame is grounded (if conductor 56 is broken), the measured value of the complex impedance may have an unknown complex offset that may impact the determination of the occupancy state.

Calibration Mode

In order to eliminate or determine the above-mentioned proportionality factor $\alpha$, the measurement carried out in measurement mode is repeated while adding a normative impedance $Z_{norm}$ in parallel to the unknown impedance $Z_x$. In FIG. 1, the normative impedance $Z_{norm}$ is represented as a resistor 34 of known resistance but a capacitor could be used equally well. To add the normative impedance $Z_{norm}$ in parallel to the unknown impedance $Z_x$, the microcontroller 32 closes the switch 34. Switching device 40 remains in the same state as in measurement mode.

It follows from $Z_{norm}/Z_x=I_x/I_{norm}$, where $I_x$ is the complex current across $Z_x$ and $I_{norm}$ is the complex current across $Z_{norm}$, and from $I_{tot}=I_x+I_{norm}$ that $Z_x=Z_{norm}(I_{tot}-I_x)/I_x$. Denoting $U_{out,1}$ the complex output voltage of the transimpedance amplifier 28 in measurement mode and $U_{out,2}$ the complex output voltage of the transimpedance amplifier 28 in calibration mode, one obtains $Z_x=Z_{norm}(\alpha U_{out,2}-\alpha U_{out,1})/(\alpha U_{out,1})$, where the proportionality factor $\alpha$ cancels out: $Z_x=Z_{norm}(U_{out,2}-U_{out,1})/U_{out,1}$.

Grounding Diagnostics Mode

As can be seen in FIG. 2, if the connection between seat frame connector 38 and the seat frame is defective, the electronic control module 14 cannot detect whether the seat frame is grounded (via ground conductor 54 or via switch 40.2). As indicated above, the occupancy state could be wrongly determined if it is based on the assumption that the seat frame is grounded whereas it is not, actually.

In diagnostics mode, the microcontroller first closes switch 40.1 and opens switch 40.2. Switch 34 is opened. The seat frame connector is thus connected to the output of the oscillator 30, via the resistor 42. If the seat frame is tied to ground via the ground conductor 54 and the seat frame connector is connected to the seat frame via conductor 56, current flows across the resistor 42. This results in a voltage drop, which is sensed by the microcontroller 32 via voltage taps 44 and 46. If the sensed voltage drop is sufficiently high, the seat frame may be deemed tied to ground and the electronic control module may switch to measurement mode. If, however, the microcontroller 32 senses no or too small a voltage drop, this indicates that the ground conductor 54 and/or the conductor 56 is interrupted or badly connected. If this situation arises, a further test is carried out in order to detect whether the wiring between the seat frame connector 38 and the seat frame is intact.

This test comprises a) measuring the alternating electrical current flowing between the antenna electrode 16 and ground while the seat frame connector 38 is connected to the ground conductor 58 using the switching device 40 (i.e. when switch 40.1 is open and switch 40.2 is closed); and b) measuring the alternating electrical current flowing between the antenna electrode 16 and ground while the seat frame connector 38 is connected to the reference input 28.2 of the transimpedance amplifier using the switching device 40 (i.e. when switch 40.1 is closed and switch 40.2 is open). When this test is carried out, it is assumed that at least one of the conductors 54 and 56 is defective. Supposing that only conductor 54 is defective (high-ohmic), the seat frame behaves as a driven shield electrode in situation b), which implies that no or only a small complex current flows between the antenna electrode 16 and the seat frame (i.e. across capacitance 52 in FIG. 2), whereas in situation a), seat frame is grounded via the conductor 56. Therefore, the difference of the measured currents in situations a) and b), respectively, corresponds to the current to ground across the seat frame. If $\Delta U_{out}$ denotes the difference of the output voltages of the transimpedance amplifier 28 in situations a) and b), the current to ground across the seat frame (noted $I_{sf}$) may be calculated as $I_{sf}=\alpha\Delta U_{out}$ (where $\alpha$ is the proportionality factor introduced above). The complex impedance $Z_{sf}$ between the antenna electrode 16 and the seat frame can be calculated as $Z_{sf}=U_{osc}/I_{sf}=U_{osc}/(\alpha\Delta U_{out})$. If conductor 56 is defective but conductor 54 is okay, the seat frame is tied to ground in both situations a) and b), which implies that $\Delta U_{out}$ will be small. If both conductors 54 and 56 are defective, the seat frame is floating in both situations a) and b), resulting also in a small voltage difference $\Delta U_{out}$. It follows that the microcontroller 32 may use the voltage difference $\Delta U_{out}$ as an indicator of the health state of conductor 56. In particular, the microcontroller 32 considers the test passed if $\Delta U_{out}$ exceeds a predefined threshold and failed otherwise. It issues an error message on its output 60 if the test is failed in order to inform any client appliance (warning lamp, airbag inflation system, seat belt reminder, or the like) that the capacitive sensor 12 does not operate correctly. The error message may indicate the reason of the fault ("bad seat grounding"), which is useful if the microprocessor is configured to detect other errors.

Figure 3:
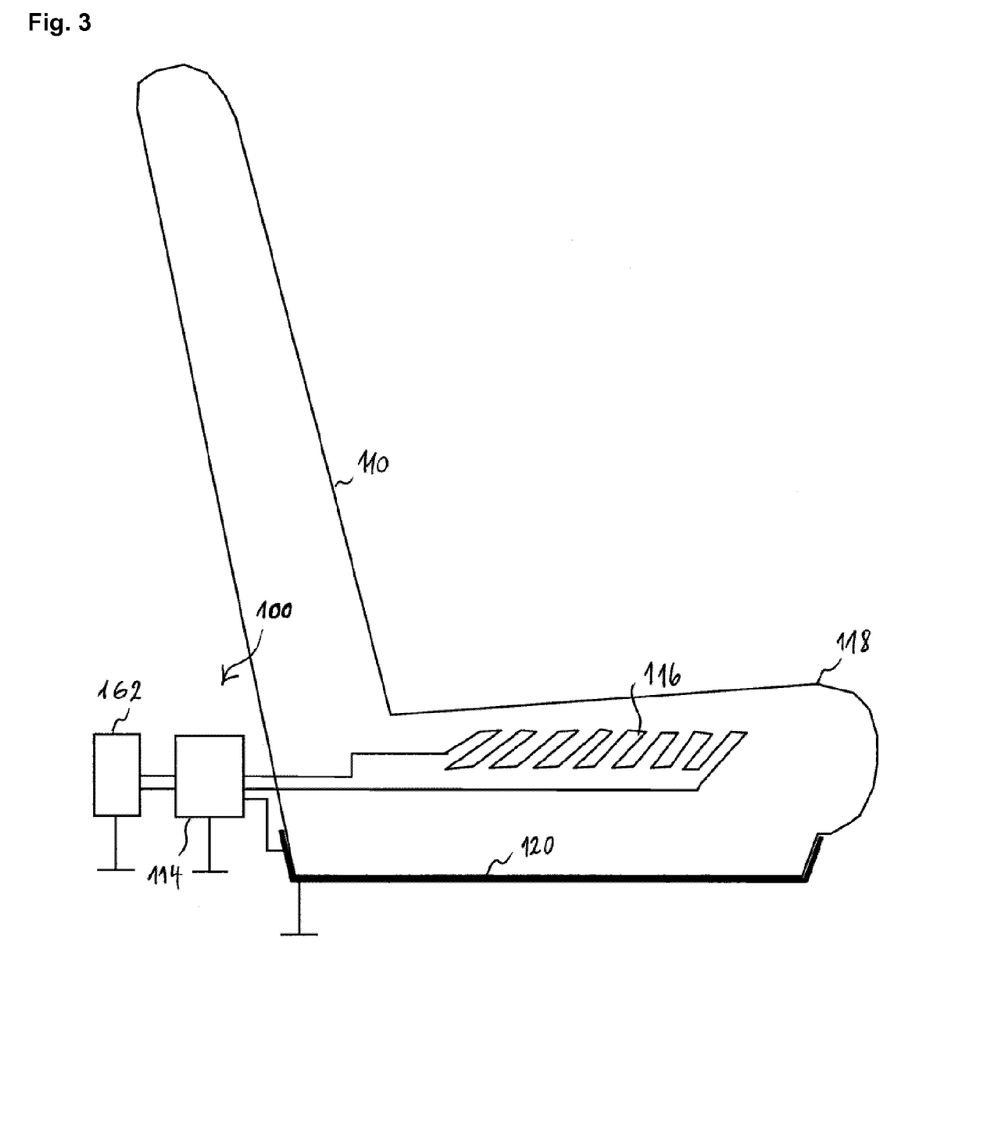
FIG. 3 is a schematic view of a car seat equipped with a combined heating and capacitive sensing device according to a second preferred embodiment of the invention.
Figure 4:
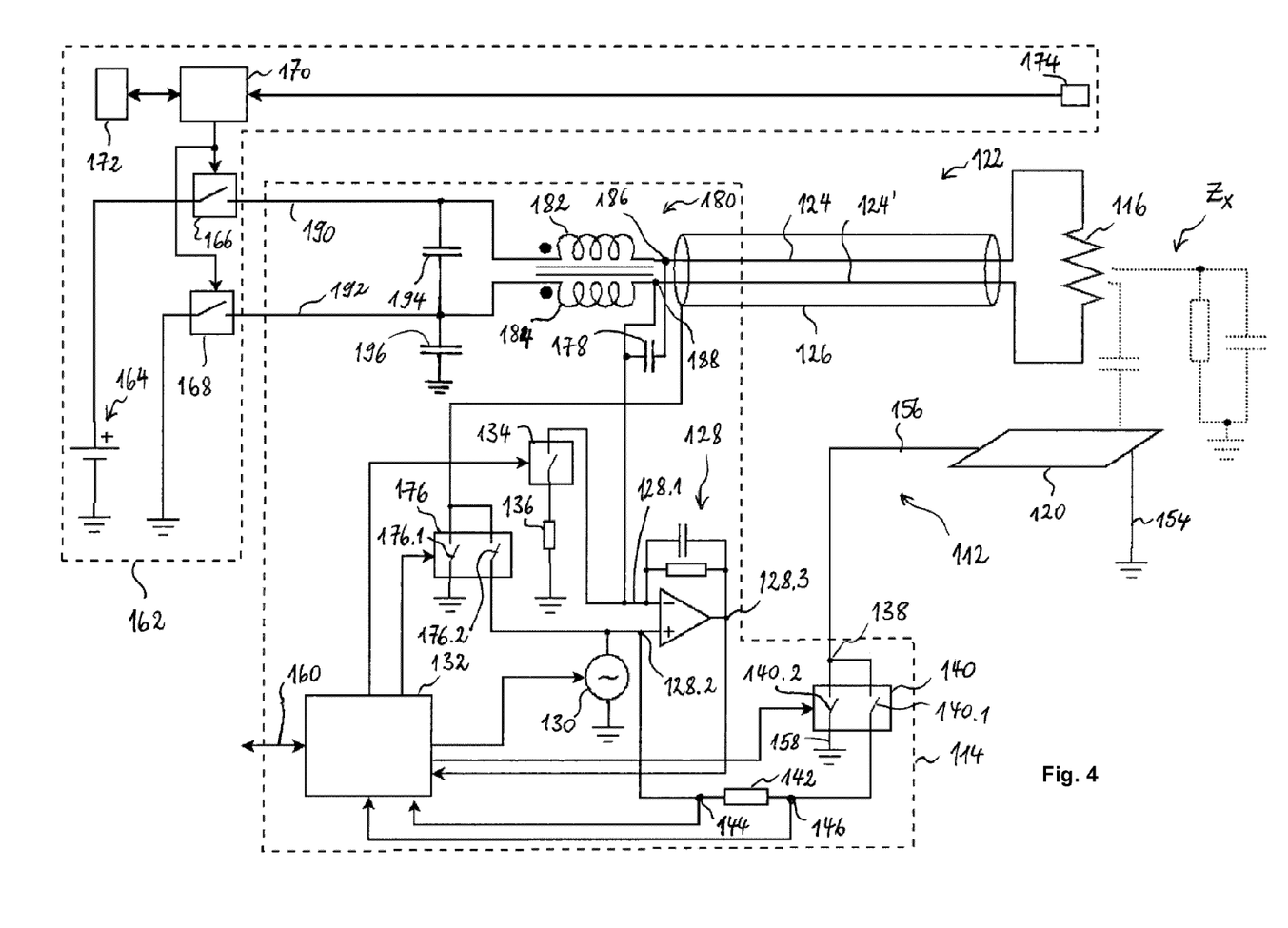
FIG. 4 is a schematic diagram of the circuitry of the combined heating and capacitive sensing device of FIG. 3.

FIG. 3 shows car seat 110 equipped with a combined heater and capacitive sensor device 100 according to a further preferred embodiment of the invention. The combined heater and capacitive sensor device 100 is arranged in the seating portion 118 of the vehicle seat 110. FIG. 4 schematically illustrates the circuitry of the combined heater and capacitive sensor device 100.

The combined heater and capacitive sensor device 100 comprises an ohmic heating element 116, which produces heat when traversed by an electrical current. The heating element 116 is connected between a first node 186 and a second node 188 of the electronic control module 114 of a capacitive sensor 112, via which it is connected to a heating current source 162. The heating current source 162 comprises a voltage source 164 (e.g. a car battery), a pair of electronically controlled switches 166, 168 (e.g. transistors) and a control unit 170 (e.g. a microcontroller), configured to open and close the switches 166, 168. The control unit 170 is connected to a control interface 172, which allows a user to switch the heater on and off and/or to set the desired heating power or temperature. The control unit 170 is further connected to a temperature sensor 174. The control unit 170 opens and closes the switches 166, 168 depending on the user commands (heater on or off, desired heating power or desired temperature) and the temperature sensed by the temperature sensor 174. Advantageously, the control unit 170 implements a pulse-width-modulation scheme in order to achieve the desired heating power or temperature.

The heating element 116 furthermore serves as an antenna electrode of a capacitive sensor 112. The capacitive sensor 112 comprises a control an evaluation circuit (electronic control module 114) as schematically shown in FIG. 4. The control and evaluation circuit is connected to the heating element 116 (antenna electrode) by a shielded cable 122 (e.g. a coaxial cable), which comprises a pair of core conductors (inner conductors) 124, 124' and a shield conductor (tubular shield) 126 that surrounds the core conductors 124, 124' and that is electrically insulated from them. The core conductors 124, 124' are AC-coupled to the current signal input 128.1 of a transimpedance amplifier 128, whereas the shield conductor 126 is operatively connected, via switching device 176, to the reference input 128.2 of the transimpedance amplifier 128. An alternating voltage source 130 (e.g. a numerically controlled oscillator) is connected to the reference input 128.2 of the transimpedance amplifier 128 so as to apply an alternating voltage thereto. The transimpedance amplifier 128 is configured to drive a current into its current signal input 128.1, such that the voltage difference between the reference input 128.2 and the current signal input 128.1 is substantially cancelled. The voltage produced on the output 128.3 of the transimpedance amplifier 128 is indicative of the current flowing in or out of the current signal input 128.1.

A common mode choke 180 connects the terminals of the heating element 116 to the corresponding terminals of the heating current source 162. The common mode choke 180 presents significantly lower impedance to differential mode currents (the induced magnetic fields of which substantially cancel each other in the core of the common mode choke 180), such as the heating current, than to common mode currents, such as the alternating current injected into the heating element 116 by the electronic control module 114. The connection terminals 190, 192 of the heating current source 162 are AC-coupled to ground via coupling capacitors 194, 196. These guarantee that the side of the common mode choke 180 turned away from the heating element 116 is kept at a defined AC potential (i.e. AC ground.)

The electronic control module 114 further comprises a switch 134, configured and arranged for switching a normative impedance 136 electrically in parallel to the impedance between the antenna electrode 116 and ground. The electronic control module 114 is connected to the seat frame (represented here as seat pan 120) via a seat frame connector 138. A switching device 140 is provided for connecting the seat frame connector 138 alternatively to ground or to the reference input 128.2 of the transimpedance amplifier 128.

The output 128.3 of the transimpedance amplifier 128 is connected to a microcontroller 132. The microcontroller 132 controls the operation of the numerically controlled oscillator 130, the switch 134, the switching devices 140, 176 and measures the voltage drop across the resistor 142 via voltage taps 144 and 146. The electronic control module 114 carries out different modes of operation.

Measurement Mode

In measurement mode, the microcontroller 132 keeps the switches 140.1, 176.1 and 134 open and switches 140.2 and 176.2 closed. The shield conductor 126 is thus AC-coupled to the reference input 128.2 of the transimpedance amplifier 128 and the seat frame is tied to ground. The oscillator 130 outputs an alternating voltage (e.g. in the frequency range of 50 to 750 kHz.) The transimpedance amplifier 128 attempts to maintain the current input node 128.1 at the same electric potential as the reference input 128.2, which means that the voltages on the transimpedance amplifier inputs 128.1 and 128.2 are essentially equal in frequency, amplitude and phase. The alternating voltage is applied to the heating element 116 via the core conductors 124, 124' of the shielded cable 122. Thanks to the coupling capacitor 178, both ends of the heating element 116 are kept at the same AC potential. DC potential is different, though, if the heating current source 162 is on. Since the shield conductor 126 and the core conductors 124, 124' of the shielded cable 122 are at the same electrical AC potential, the capacitance of the shielded cable 122 is essentially compensated for, i.e. during the measurement mode no alternating current flows between the core conductors 124, 124' and the shield conductor 126. It is worthwhile noting that the common mode choke 180, whose first winding 182 is connected between the high potential side of the heating current source 162 and the high (DC) potential side of the heating element 116 and whose second winding 184 is connected between the low (DC) potential side of the heating element 116 and the low potential side of the heating current source 162, essentially prevents the alternating current injected via the current signal input 128.1 from flowing to ground via the heating current source 162. It follows that, except for inevitable but small losses, all alternating current injected into the core conductors 124, 124' flows to ground via the complex impedance $Z_x$ between the heating element 116 and ground. Hence, when the complex impedance $Z_x$ changes (e.g. because a seat occupant is becoming seated on the seat), the alternating current supplied by the transimpedance amplifier 128 changes accordingly, which in turn is reflected by the alternating voltage on the output 128.3 of the transimpedance amplifier 128. The complex impedance can be calculated as $Z_x = U_{osc}/I_{TIA}$, where $U_{osc}$ is the complex voltage output by the oscillator 130 and $I_{TIA}$ is the complex current flowing into the current signal input 128.1 of the transimpedance amplifier 128. With $I_{TIA} = \alpha U_{out}$, where $\alpha$ is a proportionality factor and $U_{out}$ is the voltage output by the transimpedance amplifier 128, one obtains Zx by: $Z_x = U_{osc}/(\alpha U_{out})$.

Based on the measured value of the complex impedance, the microcontroller 132 may determine e.g. the occupancy state of the vehicle seat 110.

Calibration Mode

In order to eliminate or determine the proportionality factor $\alpha$, the measurement carried out in measurement mode is repeated while adding a normative impedance $Z_{norm}$ in parallel to the unknown impedance $Z_x$. In FIG. 3, the normative impedance $Z_{norm}$ is represented as a resistor of known resistance but a capacitor could be used equally well. To add the normative impedance $Z_{norm}$ in parallel to the unknown impedance $Z_x$, the microcontroller 132 closes the switch 134, while switching devices 140 and 176 remain in the same state as in measurement mode.

It follows from $Z_{norm}/Z_x = I_x/I_{norm}$, where $I_x$ is the complex current across $Z_x$ and $I_{norm}$ is the complex current across $Z_{norm}$, and from $I_{tot} = I_x + I_{norm}$ that $Z_x = Z_{norm}(I_{tot} - I_x)/I_x$. Noting $U_{out,1}$ the complex output voltage of the transimpedance amplifier 128 in measurement mode and $U_{out,2}$ the complex output voltage of the transimpedance amplifier 128 in calibration mode, one obtains $Z_x = Z_{norm}(\alpha U_{out,2} - \alpha U_{out,1})/(\alpha U_{out,1})$, where the proportionality factor $\alpha$ cancels out: $Z_x = Z_{norm}(U_{out,2} - U_{out,1})/U_{out,1}$.

Cable Diagnostics Mode

As can be seen in FIG. 4, if the connection between the shield conductor 126 and the reference input 128.2 of the transimpedance amplifier 128 is defective or if the shield conductor 126 is damaged, the shield conductor 126 cannot efficiently shield the core conductors 124, 124' against ground potential. A false measurement could be the consequence.

In cable diagnostics mode, the microcontroller 132 keeps switch 176.1 closed and switch 176.2 open, whereby the shield conductor 126 of the shielded cable 122 is tied to ground potential (if the system is intact.) The voltage output by the transimpedance amplifier 128 then corresponds to the sum of the complex current flowing across the capacitor formed by the shielded cable 122 and of the complex current flowing across the complex impedance $Z_x$.

Noting $Z_{cable}$ the impedance of the shielded cable 122, it follows from $Z_{cable}/Z_x = I_x/I_{cable}$, where $I_x$ is the complex current across $Z_x$ and $I_{cable}$ is the complex current across $Z_{cable}$, that $Z_{cable} = Z_x(U_{out,3} - U_{out,1})/U_{out,1}$, where $U_{out,1}$ designates the complex output voltage of the transimpedance amplifier 128 in measurement mode and $U_{out,3}$ the complex output voltage of the transimpedance amplifier 128 in cable diagnostics mode. If the measured impedance $Z_{cable}$ deviates from the expected value, the microcontroller 132 concludes that an error has occurred and produces a corresponding error message on its output 160.

It is worthwhile noting that the measured complex impedance $Z_{cable}$ may be split into a resistive component and a capacitive component. If the capacitive component $C_{cable}$ lies below a threshold capacitance, the microcontroller 132 concludes that the cable 122 is not completely shielded any more. For example, if the nominal capacitance of the cable is 500 pF per meter of cable length and the cable length is 1 m, this type of error may be deemed detected if the measured capacitance $C_{cable}$ drops below, say, 450 pF. If the resistive component $R_{cable}$ lies above a threshold resistance, the microcontroller 132 concludes that the shield conductor 126 has a bad connection to the switching device 176. In both cases, the microcontroller 132 issues an error message indicating which fault occurred.

Preferably, the error thresholds are designed with hysteresis, i.e. the threshold values leading to a cancellation of an error message are different from those at which an error message is generated. This hysteresis helps to prevent frequent toggling between the states "error detected" and "no error detected". Taking up the above example again, where an error message is generated when $C_{cable}$ drops below 450 pF, the threshold above which $C_{cable}$ must rise in order for the error message to be cancelled is set higher, e.g. at 480 pF.

Grounding Diagnostics Mode

If the connection between seat frame connector 138 and the seat frame is defective, the electronic control module 114 cannot detect whether the seat frame is grounded (via ground conductor 154 or via switch 140.2). The occupancy state could be wrongly determined if it is based on the assumption that the seat frame is grounded whereas it is not, actually.

In grounding diagnostics mode, the microcontroller 132 first closes switch 140.1 and opens switch 140.2. Switch 134 is opened, switch 176.1 is opened and switch 176.2 is closed. The seat frame connector 138 is thus connected to the output of the oscillator 130, via the resistor 142. If the seat frame is tied to ground via the ground conductor 154 and the seat frame connector 138 is connected to the seat frame via conductor 156, current flows across the resistor 142. This results in a voltage drop, which is sensed by the microcontroller 132 via voltage taps 144 and 146. If the sensed voltage drop is sufficiently high, the seat frame is deemed tied to ground and the electronic control module 114 may switch to measurement mode or to calibration mode. If, however, the microcontroller 132 senses no or too small a voltage drop, this indicates that the ground conductor 154 and/or the conductor 156 is interrupted or badly connected. If this situation arises, a further test is carried out in order to detect whether the wiring between the seat frame connector 138 and the seat frame is intact.

This test comprises a) measuring the alternating electrical current flowing between the antenna electrode 116 and ground while the seat frame connector 138 is connected to the ground conductor 158 using the switching device 140 (i.e. when switch 140.1 is open and switch 140.2 is closed); and b) measuring the alternating electrical current flowing between the antenna electrode 116 and ground while the seat frame connector 138 is connected to the reference input 128.2 of the transimpedance amplifier 128 using the switching device 140 (i.e. when switch 140.1 is closed and switch 140.2 is open). When this test is carried out, it is assumed that at least one of the conductors 154 and 156 is defective. Supposing that only conductor 154 is defective (high-ohmic), the seat frame behaves as a driven shield electrode in situation b), which implies that no or only a small complex current flows between the antenna electrode 116 and the seat frame (i.e. across capacitance 152 in FIG. 2), whereas in situation a), seat frame is grounded via the conductor 156. Therefore, the difference of the measured currents in situations a) and b), respectively, corresponds to the current to ground across the seat frame. If $\Delta U_{out}$ denotes the difference of the output voltages of the transimpedance amplifier 128 in situations a) and b), the current to ground across the seat frame (noted $I_{sf}$) may be calculated as $I_{sf}=\alpha \Delta U_{out}$ (where $\alpha$ is the proportionality factor introduced above). The complex impedance $Z_{sf}$ between the antenna electrode 116 and the seat frame can be calculated as $Z_{sf}=U_{osc}/I_{sf}=U_{osc}/(\alpha \Delta U_{out})$. If conductor 156 is defective but conductor 154 is okay, the seat frame is tied to ground in both situations a) and b), which implies that $\Delta U_{out}$ will be small. If both conductors 154 and 156 are defective, the seat frame is floating in both situations a) and b), resulting also in a small voltage difference $\Delta U_{out}$. It follows that the microcontroller 132 may use the voltage difference $\Delta U_{out}$ as an indicator of the health state of conductor 156. In particular, the microcontroller 132 considers the test passed if $\Delta U_{out}$ exceeds a predefined threshold and failed otherwise. It issues an error message on its output 160 if the test has failed in order to inform any client appliance (warning lamp, airbag inflation system, seat belt reminder, or the like) that the capacitive sensor 112 does not operate correctly. The error message preferably indicates the reason of the fault ("bad seat grounding").

While specific embodiments have been described in detail, those skilled in the art will appreciate that various modifications and alternatives to those details could be developed in light of the overall teachings of the disclosure. In particular, any numerical values given in this description are meant for illustration only. Accordingly, the particular arrangements disclosed are meant to be illustrative only and not limiting as to the scope of the invention, which is to be given the full breadth of the appended claims and any and all equivalents thereof.

The invention claimed is:
1. Capacitive sensor for a vehicle seat, comprising
   an antenna electrode for being arranged in said vehicle seat;
   a control and evaluation circuit operatively connected to said antenna electrode, said control and evaluation circuit comprising at least one measurement circuit, and
   a seat frame connector for connecting said control and evaluation circuit to a seat frame of said vehicle seat;
   wherein said control and evaluation circuit is configured to temporarily couple said measurement circuit to the seat frame of the vehicle seat via said seat frame connector, and
   wherein said control and evaluation circuit is configured to operate in a first mode of operation, during which said control and evaluation circuit is configured to measure an alternating electrical current flowing between said antenna electrode and ground, and in a second mode of operation, during which said control and evaluation circuit is configured to measure an electrical current flowing into said seat frame connector when said measurement circuit is temporarily coupled to the seat frame of the vehicle.

2. Capacitive sensor as claimed in claim 1, wherein said measurement circuit of said control and evaluation circuit comprises an oscillator and a transimpedance amplifier having a reference input, a current signal input operatively couplable to said antenna electrode, and an output, said oscillator being connected to said reference input for applying said alternating voltage thereto, said transimpedance amplifier being configured to drive an alternating current into said current signal input such that a voltage difference between said reference input and said current signal input is substantially cancelled and to output a voltage on said output indicative of said alternating current.

3. Capacitive sensor as claimed in claim 2, wherein said current signal input is operatively coupled to said antenna electrode for injecting said alternating current into said antenna electrode.

4. Capacitive sensor as claimed in claim 1, comprising a switching device configured and arranged to operatively connect said seat frame connector alternately to a ground conductor and to said measurement circuit.

5. Capacitive sensor as claimed in claim 4, wherein said control and evaluation circuit is configured, when in said second mode of operation and if said measured electrical current flowing into said seat frame connector fails to meet a criterion allowing to conclude that the seat frame is grounded, to carry out the following:
   a) measuring an alternating electrical current flowing between said antenna electrode and ground while connecting said seat frame connector to said ground conductor using said switching device and
   b) measuring an alternating electrical current flowing between said antenna electrode and ground while connecting said seat frame connector to said reference input using said switching device.

6. Capacitive sensor as claimed in claim 5, wherein said control and evaluation circuit is configured to determine whether at least one path to ground is available to said seat frame based upon said measurements a) and b) and to output an error signal if no path to ground is determined to be available to said seat frame.

7. Capacitive sensor as claimed in claim 1, wherein said measurement circuit of said control and evaluation circuit comprises a current meter configured and arranged to measure electrical current flowing into said seat frame connector.

8. Capacitive sensor as claimed in claim 7, wherein said current meter comprises an impedor arranged between said oscillator and said seat frame connector, said impedor comprising at least one of a resistor, a capacitor and an inductor, and wherein said current meter further comprises a voltage detector configured and arranged to measure voltage across said impedor.

9. Vehicle seat comprising a capacitive sensor as claimed in claim 1.

10. Combined heating and capacitive sensing system for a vehicle seat, said combined heating and capacitive sensing system including a heating element for being arranged in said vehicle seat and a capacitive sensor, said heating element being operable as antenna electrode for said capacitive sensor;
   said capacitive sensor further comprising a control and evaluation circuit operatively connected to said antenna electrode, said control and evaluation circuit comprising at least one measurement circuit, and
   a seat frame connector for connecting said control and evaluation circuit to a seat frame of said vehicle seat;

wherein said control and evaluation circuit is configured to temporarily couple said measurement circuit to the seat frame of the vehicle seat via said seat frame connector, and wherein said control and evaluation circuit is configured to operate in a first mode of operation, during which said control and evaluation circuit is configured to measure alternating electrical current flowing between said antenna electrode and ground, and in a second mode of operation, during which said control and evaluation circuit is configured to measure electrical current flowing into said seat frame connector when said measurement circuit is temporarily coupled to the seat frame of the vehicle.

11. Vehicle seat comprising a combined heating and capacitive sensing system as claimed in claim 10.

* * * * *